US006952347B2

(12) United States Patent
Baeumel et al.

(10) Patent No.: US 6,952,347 B2
(45) Date of Patent: Oct. 4, 2005

(54) POWER MODULE

(75) Inventors: Hermann Baeumel, Neumarkt (DE); Werner Graf, Nuremberg (DE); Hermann Kilian, Diespeck (DE); Bernhard Schuch, Neusitz (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 0 days.

(21) Appl. No.: 10/466,588

(22) PCT Filed: Dec. 10, 2001

(86) PCT No.: PCT/EP01/14464

§ 371 (c)(1),
(2), (4) Date: Jul. 16, 2003

(87) PCT Pub. No.: WO02/058142

PCT Pub. Date: Jul. 25, 2002

(65) Prior Publication Data

US 2004/0057208 A1 Mar. 25, 2004

(30) Foreign Application Priority Data

Jan. 20, 2001 (DE) ........................................ 101 02 621

(51) Int. Cl.$^{7}$ .......................... H05K 7/20; H01L 23/36

(52) U.S. Cl. ...................... 361/710; 361/709; 361/719; 361/697; 257/722

(58) Field of Search ................................ 361/704, 705, 361/706–712, 717–722, 697; 257/705, 706, 707, 713, 717–719, 721, 722

(56) References Cited

U.S. PATENT DOCUMENTS

| | | | | |
|---|---|---|---|---|
| 3,766,440 A | | 10/1973 | Baird | |
| 4,546,410 A | * | 10/1985 | Kaufman | 361/705 |
| 5,041,902 A | * | 8/1991 | McShane | 257/706 |
| 5,158,912 A | * | 10/1992 | Kellerman et al. | 438/126 |
| 5,212,627 A | * | 5/1993 | No | 361/715 |
| 5,294,831 A | | 3/1994 | Azar et al. | |
| 6,140,571 A | * | 10/2000 | Kitahara et al. | 174/16.3 |
| 6,198,183 B1 | | 3/2001 | Baeumel et al. | |
| 6,212,074 B1 | * | 4/2001 | Gonsalves et al. | 361/717 |
| 6,326,678 B1 | * | 12/2001 | Karnezos et al. | 257/666 |
| 6,614,123 B2 | * | 9/2003 | Lee et al. | 257/796 |
| 6,729,383 B1 | * | 5/2004 | Cannell et al. | 165/80.3 |
| 2002/0018338 A1 | * | 2/2002 | McCullough | 361/709 |
| 2002/0043402 A1 | * | 4/2002 | Juskey et al. | 174/260 |
| 2003/0038382 A1 | * | 2/2003 | Combs | 257/796 |

FOREIGN PATENT DOCUMENTS

| | | | |
|---|---|---|---|
| DE | 4238417 | 5/1993 | |
| DE | 19527867 | 1/1997 | |
| EP | 0551726 | 7/1993 | |
| FR | 2308072 | 11/1976 | |
| GB | 2261549 | 5/1993 | |
| JP | 57069768 | 4/1982 | |
| JP | 02276264 A * | 11/1990 | H01L/23/36 |

OTHER PUBLICATIONS

H. R. Pilgrim, "Ceramic Substrate With Inherent Heat Exchanger", IBM Technical Disclosure Bulletin, No.: XP–002237832, vol. 12, No. 5, New York, USA, Oct. 1, 1969, pp. 728–729.

* cited by examiner

*Primary Examiner*—Anatoly Vortman
(74) *Attorney, Agent, or Firm*—W. F. Fasse; W. G. Fasse

(57) ABSTRACT

A power module is suggested having a simple and cost-effective arrangement and ensuring a reliable operation. To this end, a circuit arrangement comprising at least one electronic component is arranged on a carrier body. A conductor pattern is formed on the top side of the carrier body, and a structured cooling element made of the material of the carrier body, is provided on the bottom side. The invention also relates to a power module as power converter for electric motors.

5 Claims, 2 Drawing Sheets

POWER MODULE

FIELD OF THE INVENTION

Electronic modules are used in many areas for different objectives and applications. Electronic modules constructed as power modules are used particularly for control purposes, for example for the closed loop control of the r.p.m. and of the power of electric motors.

BACKGROUND INFORMATION

Electronic components for providing the required power are part of such power modules. For example, in connection with electric motors the power is typically in the kilowatt range. Power modules are used for providing control signals and/or for the evaluation of measured signals. As a rule, the active and passive components of the circuit arrangement of such power module require a construction that has a low inductance to avoid excess voltages. Active components include, for example, power components that are working in a switching operation at high speed current changes, particularly integrated switching circuits operating as power switches. Passive components include, for example resistors, for example shunts for current measuring, and capacitors. Thus, the circuit arrangement of the power module is customarily applied on an insulating carrier body or an insulating substrate consisting as a rule of a ceramic material. For mechanical stabilization and for heat dissipation of the dissipation power of the components of the circuit arrangement, particularly the power components, the carrier body is secured to a massive metallic cooling body, for example a copper or an aluminum plate. The carrier body is secured to the cooling body by a bonding layer, for example by means of solder or a heat conducting paste to form a thermal connection. The insulation or potential separation between the electronic components of the circuit arrangement and the cooling body is realized through the insulating carrier body.

The substrate or the carrier body and the cooling body have different thermal expansion coefficients since the former is made of ceramic material and the latter is made of metal. Therefore, the substrate and the cooling body have different thermal expansions. As a result, on the one hand, a relatively thick bonding layer is required between the carrier body and the cooling body, particularly in connection with a carrier body having a large surface for equalizing tensions. The thick bonding layer causes a high heat resistance particularly due to inclusions in the bonding layer such as shrink holes in a solder layer, which negatively influence the heat conductivity. Thus, a poor heat transition exists between the electronic components of the circuit arrangement and the cooling body due to the heat resistances that are formed by the inclusions. As a result, the dissipation of the dissipation power of the electronic components becomes difficult. On the other hand, the connection between the carrier body and the cooling body is frequently impaired, whereby the life duration and thus the reliability of the power modules is significantly reduced. This is particularly true where the power module must work in a large temperature range and under the temperature changes that such a large range entails.

OBJECT OF THE INVENTION

It is the object of the invention to provide a power module that has a simple construction and can be easily produced at low cost while achieving a high reliability and advantageous thermal characteristics.

SUMMARY OF THE INVENTION

This object has been achieved according to the invention in a power module that is characterized by the combination of the following features: a carrier body made of an electrically insulating and heat conducting material, said carrier body having a top surface and a bottom surface, an electric circuit arrangement including at least one electronic component secured to said top surface of said carrier body and a conductor structure directly formed on said top surface of said carrier body to form said electric circuit arrangement, a plurality of frustum shaped cooling members formed integrally with said bottom surface and of the same material as said carrier body, said frustum shaped cooling members being arranged in spaced and staggered rows thereby forming coolant flow channels, each of said frustum shaped cooling members having beveled surfaces slanting away from said bottom surface so that said coolant flow channels widen away from said bottom surface for guiding coolant away from said bottom surface for an efficient heat transport.

The following components are particularly provided as parts of the power module. A thick carrier body is made of an insulating material which has a high heat conductivity, which, for example, is made as a ceramic carrier of a ceramic material such as aluminum oxide $Al_2O_3$ or aluminum nitride AlN. The carrier body can be produced by drop forging tools, for example by dry presses or by means of injection casting followed by sintering. The thickness of the carrier body is selected with regard to the following measures, its size, particularly it surface area, and the mechanical loads that are caused by the installation of the power module at its point of use, for example by a screw connection and which loads are further caused by the cooling, for example by the pressure of a coolant in a cooling circuit to which the power module is connected. A structured partial section of the ceramic carrier body functions simultaneously as a cooling element wherein geometric cooling members project from the bottom of the carrier body to form together the cooling element. The geometric members are made of the same material as that of the carrier body. These geometric members are provided in an array in a determined arrangement and with a determined geometric form, for example in the shape of a frustum.

A metallic conductor structure is applied to the top surface of the carrier body. The conductor structure includes conductor tracks, mounting positions, contact pads, and terminal positions directly applied to the surface of the ceramic carrier body that is without any intermediate layers, for example by active soldering (active metal bonding) in that the conductor structure is chemically soldered directly to the surface of the carrier body by an oxide bonding or by a DCB-method. The DCB-method involves mechanically anchoring the conductor structure in the carrier body through the molten metal of the conductor structure, particularly in the pores of the ceramic carrier body. The electronic components of the circuit arrangements are interconnected through the conductor structure with one another and/or with connector contacts in an electrically conducting manner.

The electronic components of the circuit arrangement are mounted in respective mounting positions of the conductor structure, particularly the power components, for example in the form of silicon chips. The mounting may for example be accomplished with soft solder or by pressing. The silicon chips are contacted with each other and/or with the conductor structure, for example by means of wire bonds by contacting the terminals of the electronic components through bond wires with certain contact pads of the conductor structure or with terminals of further components. The connection may also be done by a low temperature sintering method by a direct application of the terminals of the electronic components to one another and sintering. Furthermore, connector contacts are secured to the terminal positions of the conductor structure for the external connection of the power module to further structural groups or components.

The heat dissipation of the circuit arrangement or rather the dissipation of the dissipation power of the electronic components of the circuit arrangement takes place through the structured cooling element formed of the cooling members on the underside of the carrier body. The cooling members face away from the bottom surface of the carrier body and form its bottom side opposite its top surface. The contour of the cooling element is determined by all cooling members arranged in an array. The array includes a multitude of similarly structured geometric cooling members which are adapted to the shape of the carrier body. The size or surface area of the array depends on the dissipation power that must be dissipated. Stated differently, the required cooling function must be assured by all geometric cooling members of the cooling array. Accordingly, a certain number of geometric cooling members is arranged equidistant one behind the other for forming rows and columns. The geometric cooling members of two neighboring rows are respectively staggered relative to one another, preferably in such a way that the geometric cooling members of one row are positioned in the gap that is defined by the spacing of the geometric members of the neighboring rows.

The shape, number and arrangement of the geometric cooling members, particularly the arrangement of the geometric members relative to one another and the arrangement of the geometric cooling members in the array is adapted to the respective purpose of use of the power module and to the required cooling power. The geometric cooling members are, for example, shaped as rhombuses, frustums, pegs, or lentils and have slightly slanted side surfaces. The cooling element with its cooling members is produced in the same production step and in the same tool as the carrier body, for example, in a drop forging tool, or by means of dry presses or by means of injection molding followed by sintering. That means, the geometric cooling members that are made of the same material as the carrier body are removed together with the carrier body from a mold having a respective mold pattern. The cooling element with its array of the geometric cooling members is particularly integrated into a cooling circuit. For example, a coolant such as water or air of the cooling circuit flows through the array. The flow channels for the coolant of the cooling circuit are formed by the geometric cooling members of the array whereby the coolant flows between the geometric cooling members, or rather between the various rows of geometric cooling members. The heat transition from the carrier body through the cooling element to the coolant can be adjusted or adapted by predetermining the arrangement and the structure or shape of the geometric cooling members and thus of the array.

The power module combines several advantages. The carrier body serves for the heat dissipation and as a circuit carrier or substrate for the electronic components of the circuit arrangement. The carrier body also serves as a seal when the power module is directly arranged in a cooling circuit and thus it serves for the integration of the array of the geometric cooling members into the cooling circuit. By the direct mounting of the electronic components of the circuit arrangement on the carrier body and by the direct connection of the geometric cooling members to the carrier body without any intermediate layers a small thermal resistance is obtained, whereby thermal problems can be avoided so that a high reliability and useful life of the power module are achieved. By preselecting the structure of the geometric cooling members a sufficient heat dissipation of the electronic components of the circuit arrangement is assured, particularly a variably selectable heat dissipation can be achieved by a respective shaping of the geometric cooling members of the cooling element so that particularly in connection with an integration of the cooling element into the cooling circuit of a cooling system the through-flow velocity of the coolant and the pressure loss in the cooling circuit can be adapted to the requirements. The production effort and expense is small because a simple production of the cooling element with its geometric cooling members is possible, particularly when the carrier body and the geometric cooling members are made in a single production step in the same tool. Thereby, manufacturing problems can be avoided which entails small manufacturing costs, particularly also due to the use of simple and low cost materials.

BRIEF DESCRIPTION OF THE DRAWINGS

The power module will be explained with reference to an example embodiment in connection with the accompanying drawings, wherein.

Figure 1:
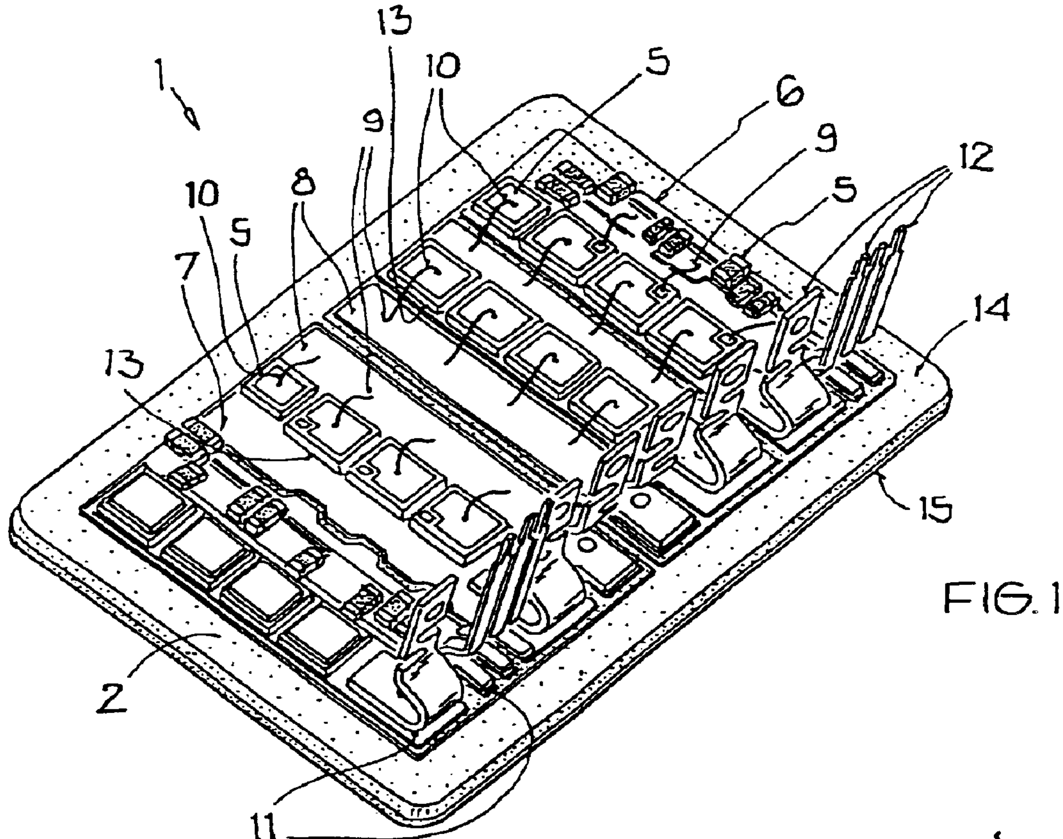
FIG. 1 shows a view of the top side of the power module.

DETAILED DESCRIPTION OF PREFERRED EXAMPLE EMBODIMENTS AND OF THE BEST MODE OF THE INVENTION

The power module 1 is for example used as a power converter for liquid cooled electric motors in the field of motor vehicles where a power of for example 10 kW is generated or used. Due to the occurring high dissipation power the power converter 1 is coupled directly to the liquid cooling flow of the electric motor, i.e. it is integrated into the cooling circuit of the electrical motor whereby a coolant such as water flows through the cooling circuit.

The power converter 1 comprises a carrier body 2 as a circuit carrier formed, for example as a ceramic substrate or ceramic carrier made of, for example aluminum nitride (AlN). The body 2 has for example the dimensions of 90 mm×57 mm×3 mm. The carrier body 2 is directly integrated into the cooling circuit and thus takes over the sealing of the cooling circuit relative to the further components of the power converter 1.

A conductor structure 7 having a thickness of, for example 0.3 mm is applied to the top side or surface 14 of the carrier body 2. The conductor structure 7 is made, for example of copper and includes conductor tracks 8, mounting positions 13, contact pads 9 and terminal positions 11. The conductor structure 7 is applied to the carrier body 2, for example by a direct or active soldering process, or by chemical soldering. The electronic components 5 of the circuit arrangement 6 are contacted at the contact pads 9, i.e. connected in an electrically conducting manner with the conductor structure 7. Connector contacts 12 are secured to the terminal positions 11, for example soldered by means of solder 20.

A circuit arrangement 6 comprising the electronic components 5 is positioned on and secured to the carrier body 2. The circuit arrangement 6 comprises particularly power components for realizing the converter function and the resulting control of the electric motor. The electronic components 5 of the circuit arrangement 6 are silicon chips which are secured to the mounting positions 13 of the conductor structure 7, for example by means of a soft soldering process. For example, the chips are connected through bond connections 10 with the contact positions 9 of the conductor tracks 8 of the conductor structure 7 and/or with other electronic components 5.

Figure 2:
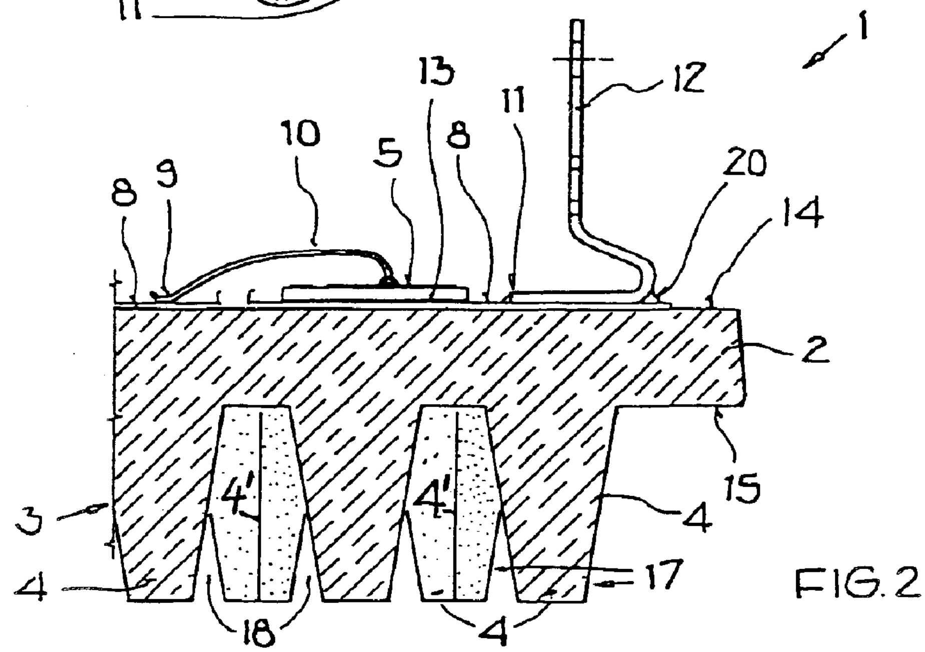
FIG. 2 is a sectional view through the power module.
Figure 3:
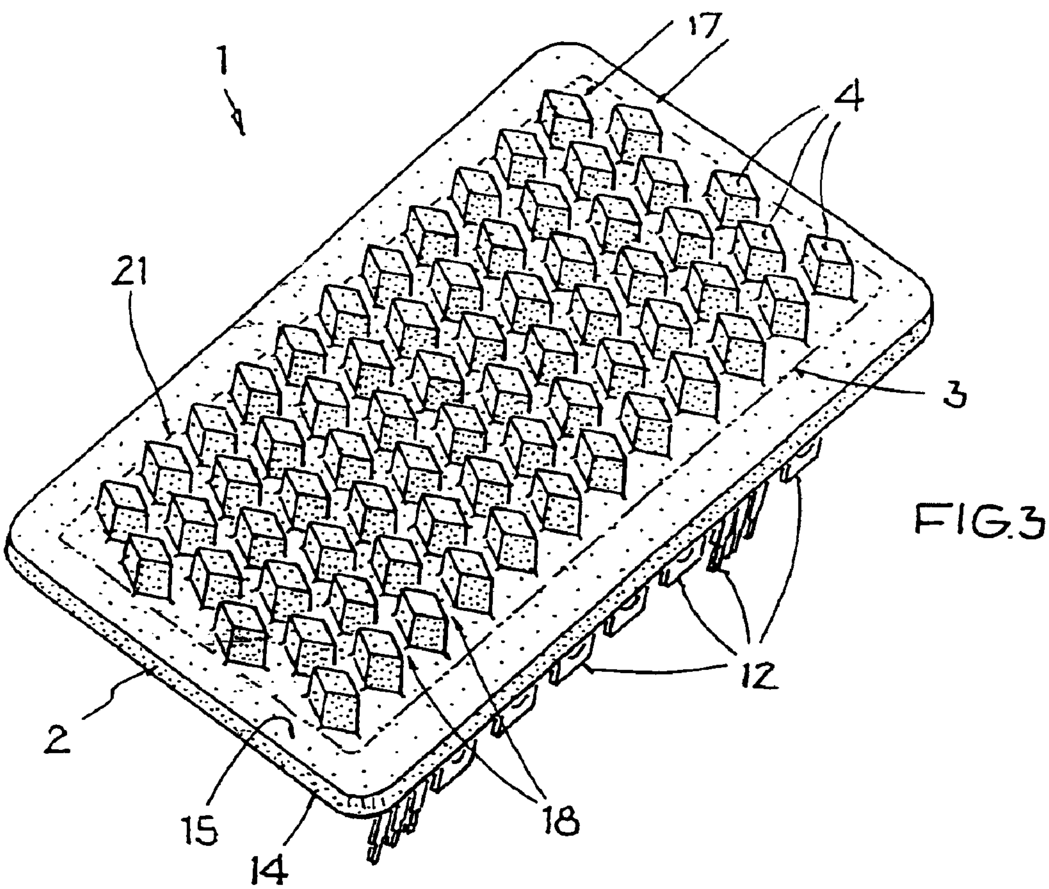
FIG. 3 shows a bottom view of the present power module.

The dissipation power of the electronic components 5 of the circuit arrangement 6, particularly of the power components, is discharged through the carrier body 2 and the cooling element 3 to the cooling circuit through which the cooling water is flowing. For this purpose the cooling element 3 is arranged on the underside or bottom surface 15 of the carrier body 2 opposite the top surface 14. The cooling element 3 is produced together with the carrier body 2 for example in a drop forging tool by pressing and is made, for example of aluminum nitride (AlN). The cooling element 3 is structured in a certain manner for forming an array 21 of geometric cooling members 4, whereby the geometric cooling members 4 of the cooling element 3, for example have a shape similar to a rhombus or frustum. The side surfaces of the shape are slightly beveled. For forming flow channels 18 for the coolant, a certain number of the geometric cooling members 4 of the cooling element 3 is arranged in a row 17 equidistant one behind the other. The geometric cooling members 4 of different neighboring rows 17 are staggered relative to one another. Particularly, two neighboring rows 17 are so staggered that the geometric cooling members 4 of a row 17 are positioned to face the gap that is defined by the spacing between the geometric cooling members 4 of the neighboring row 17. FIG. 2 shows particularly that, due to the staggering, edges 4 of the cooling members 4 of one row 17 face the gap between two neighboring cooling members of a neighboring row 17 whereby the coolant is forced to follow a zig-zag flow for an improved surface contact between the coolant and the cooling members 4. For example, twelve geometric elements 4 are arranged one behind the other in a row 17 along a length of, for example 80 mm. Six different rows 17, for example are arranged staggered to one another on a width of, for example 40 mm. The geometric cooling members 4 of the cooling element 3 project with a height of, for example 6 mm into the cooling circuit of the electric motor and the coolant water flows through the flow channels 18 of the cooling element 3. These channels 18 are formed by the arrangement of the geometric cooling members 4 which have the above mentioned beveled surfaces that slant away from the bottom surface 15 whereby the coolant flow channels 18 are wider away from the bottom surface 15 than at the bottom surface. As a result a certain flow direction and a certain flow velocity of the cooling water is predetermined or enforced whereby the heat removal efficiency is improved.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A power module comprising in combination: a carrier body (2) made of an electrically insulating and heat conducting material, said carrier body having a top surface (14) and a bottom surface (15), an electric circuit arrangement (6) including at least one electronic component (5) secured to said top surface (14) of said carrier body (2) and a conductor structure (7) directly formed on said top surface (14) of said carrier body to form said electric circuit arrangement (6), a plurality of frustum shaped cooling members (4) formed integrally with said bottom surface (15) and of the same material as said carrier body (2), and wherein said frustum shaped cooling members (4) are arranged in spaced and staggered rows (17) thereby forming longitudinal and crosswise coolant flow channels (18), each of said frustum shaped cooling members (4) having slanted surfaces slanting away from said bottom surface (15) so that said coolant flow channels (18) widen away from said bottom surface (15) for guiding coolant away from said bottom surface (15) for an efficient heat transport.

2. The power module of claim 1, wherein said spaced and staggered rows (17) of said frustum shaped cooling members (4) are arranged in an array.

3. The power module of claim 1, wherein said frustum shaped cooling members (4) are arranged at an equal spacing from one another.

4. The power module of claim 1, wherein said conductor structure (7) arranged on said top surface (14) of the carrier body (2) comprises conductor tracks (8), mounting positions (13) for holding said at least one electronic component (5) of the circuit arrangement (6), contact pads (9) for contacting the electronic components (5) of the circuit arrangement (6) and terminal positions (11) for the connection of the connector contacts (12).

5. The power module of claim 1, wherein said staggered rows (17) of frustum shaped cooling members (4) are so staggered relative to each other that edges (4') of said frustum shaped cooling members (4) of one row (17) face a respective gap between two neighboring frustum shaped cooling members (4) in a neighboring row (17) of frustum shaped cooling members.

* * * * *